(12) United States Patent
Jansen et al.

(10) Patent No.: US 10,690,700 B2
(45) Date of Patent: *Jun. 23, 2020

(54) MULTIPLE CORE TRANSFORMER ASSEMBLY

(71) Applicant: Leviton Manufacturing Company, Inc., Melville, NY (US)

(72) Inventors: Ronald Jansen, Ridgewood, NY (US); Michael Kamor, North Massapequa, NY (US); Michael Ostrovsky, Brooklyn, NY (US); Alfred J. Lombardi, Syosset, NY (US)

(73) Assignee: Leviton Manufacturing Company, Inc., Melville, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/434,409

(22) Filed: Jun. 7, 2019

(65) Prior Publication Data

US 2019/0285668 A1  Sep. 19, 2019

Related U.S. Application Data

(63) Continuation of application No. 15/287,837, filed on Oct. 7, 2016, now Pat. No. 10,317,431.

(51) Int. Cl.
| | |
|---|---|
| *G01R 15/18* | (2006.01) |
| *H01H 1/00* | (2006.01) |
| *H01H 83/14* | (2006.01) |
| *G01R 31/50* | (2020.01) |
| *G01R 19/00* | (2006.01) |
| *H01F 17/04* | (2006.01) |
| *H01F 41/02* | (2006.01) |
| *H02H 3/16* | (2006.01) |
| *H02H 1/00* | (2006.01) |
| *H02H 3/33* | (2006.01) |

(52) U.S. Cl.
CPC ....... *G01R 15/183* (2013.01); *G01R 19/0092* (2013.01); *G01R 31/50* (2020.01); *H01F 17/04* (2013.01); *H01F 41/0206* (2013.01); *H01H 1/00* (2013.01); *H01H 83/144* (2013.01); *H02H 3/16* (2013.01); *H01H 2083/146* (2013.01); *H02H 1/0007* (2013.01); *H02H 3/33* (2013.01)

(58) Field of Classification Search
CPC ................ G01R 15/183; G01R 31/025; G01R 19/0092; H01H 83/144; H01H 1/00; H01H 2083/146; H02H 3/16; H02H 3/33; H02H 1/0007; H01F 41/0206; H01F 17/04
See application file for complete search history.

(56) References Cited

U.S. PATENT DOCUMENTS

| | | | |
|---|---|---|---|
| 3,665,356 A * | 5/1972 | Douglas | .................. H01F 27/36 336/73 |
| 4,567,456 A | 1/1986 | Legatti | |
| 5,774,320 A | 6/1998 | Seymour | |

(Continued)

*Primary Examiner* — Lee E Rodak
(74) *Attorney, Agent, or Firm* — Carter, DeLuca & Farrell LLP; George Likourezos

(57) ABSTRACT

A circuit interrupting device includes a grounded neutral transformer core, a high frequency transformer core, and a differential transformer core nested within the grounded neutral transformer core and/or the high frequency transformer core. The grounded neutral transformer core and the high frequency transformer core are disposed in a stacked configuration with one another.

22 Claims, 11 Drawing Sheets

(56) References Cited

U.S. PATENT DOCUMENTS

| | | | |
|---|---|---|---|
| 5,917,686 | A | 6/1999 | Chan |
| 6,199,264 | B1 | 3/2001 | Marcou |
| 6,442,006 | B1 | 8/2002 | Baertsch et al. |
| 6,567,250 | B1 | 5/2003 | Haun et al. |
| 7,019,952 | B2 | 3/2006 | Huang et al. |
| 8,587,914 | B2 | 11/2013 | Kamor et al. |
| 9,053,886 | B2 | 6/2015 | Kamor et al. |
| 10,317,431 | B2 | 6/2019 | Jansen et al. |
| 2005/0286184 | A1* | 12/2005 | Campolo ............ H01R 25/003 361/42 |
| 2007/0279162 | A1 | 12/2007 | Zhang et al. |
| 2014/0218044 | A1* | 8/2014 | Ostrovsky ............ G08B 21/185 324/509 |
| 2015/0200070 | A1 | 7/2015 | Kamor et al. |
| 2015/0333498 | A1 | 11/2015 | Weeks |

\* cited by examiner

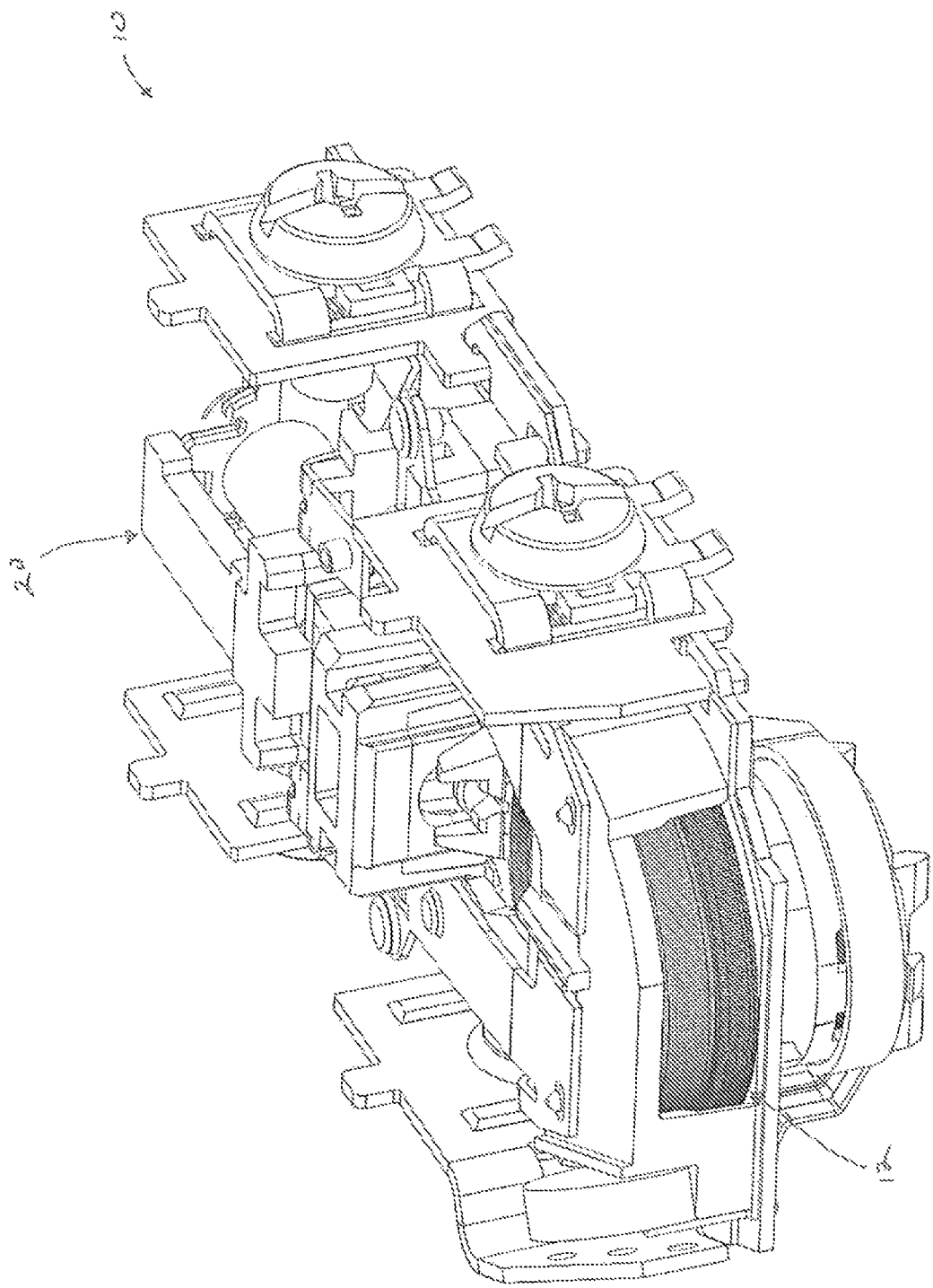

MULTIPLE CORE TRANSFORMER ASSEMBLY

CROSS-REFERENCE TO RELATED APPLICATION

This application is a continuation application of U.S. patent application Ser. No. 15/287,837, filed on Oct. 7, 2016, the entire contents of which are incorporated by reference herein.

BACKGROUND

Technical Field

The present disclosure relates to fault circuit interrupters and, more particularly, but not exclusively, to combined arc fault and ground fault circuit interrupters.

Related Art

Electrical devices such as fault circuit interrupters are typically installed into a wall box/electrical box and are typically installed within/on a wall. Typically, the depth of the wall box is constrained by the depth of the wall and/or the depth of the wall's framing members. Electrical wiring is typically fed into a region of the wall box for electrical connections to/from the electrical device(s) resulting in a portion of the wall box's volume/depth being utilized by this wiring, while the remaining volume/depth of the wall box is utilized by an installed electrical device. Wall boxes are typically configured to receive two electrical connections, one for line and the other for load, each containing a phase wire, a neutral wire and a ground wire, for a total of five or even six wires being fed/connected into the wall box. Since normal installation of electrical devices is typically constrained by the distance in which they may extend beyond the finished wall surface, the greater the depth of the housing of the electrical device, the harder it is to fit an electrical device within the constraints posed by the electrical wall box and the finished wall surface.

In many cases, circuit interrupters are incorporated into single gang electrical devices such as duplex receptacles, a switch or combination switch receptacles. Single gang electrical enclosures, such as a single gang wall boxes, are standardized in the electrical industry via NEMA Standard OS-1. For example, a single-gang wall box has a nominal height of about 3 inches and a nominal width of about 2 inches.

Due to the space restraints, and because of the complexity of electrical designs of fault circuit interrupter designs in general (i.e., circuit interrupters typically include a number of electrical components), circuit interrupter designs based upon the present state of the art are challenged for reduction in the depth of the device.

SUMMARY

The following presents a summary of the claimed subject matter in order to provide a basic understanding of some aspects of the claimed subject matter. This summary is not an extensive overview of the claimed subject matter. It is intended to neither identify key or critical elements of the claimed subject matter nor delineate the scope of the claimed subject matter. Its sole purpose is to present some concepts of the claimed subject matter in a simplified form as a prelude to the more detailed description that is presented later.

In an aspect of the present disclosure, a circuit interrupting device is provided and includes a grounded neutral transformer core, a high frequency transformer core, and a differential transformer core. The grounded neutral transformer core and the high frequency transformer core disposed in a stacked configuration with one another. The differential transformer core is nested within the grounded neutral transformer core and/or the high frequency transformer core.

In some embodiments, the differential transformer core may extend along an entire height of the grounded neutral transformer core and an entire height of the high frequency transformer core.

It is contemplated that the differential transformer core may extend along an entire height of the grounded neutral transformer core and only partially along a height of the high frequency transformer core.

It is envisioned that the differential transformer core may extend along an entire height of the high frequency transformer core and only partially along a height of the grounded neutral transformer core.

In some embodiments, the grounded neutral transformer core, the high frequency transformer core, and/or the differential transformer core may have a substantially rectangular cross-section.

It is contemplated that the grounded neutral transformer core and the high frequency transformer core may cooperatively define a cavity therein and that the differential transformer core received within the cavity. The differential transformer core may extend through an entire height of the cavity.

It is envisioned that each of the grounded neutral transformer core and the high frequency transformer core may include a top surface and a bottom surface. The bottom surface of the grounded neutral transformer core or the bottom surface of the high frequency transformer core may be supported on the top surface of the other of the grounded neutral transformer core or the high frequency transformer core.

In some embodiments, the grounded neutral transformer core and the high frequency transformer core may be coaxial with one another.

It is contemplated that the differential transformer core may be disposed concentrically within the grounded neutral transformer core and/or the high frequency transformer core.

It is envisioned that each of the grounded neutral transformer core and the high frequency transformer core may define an inner chamber therein and that the differential transformer core may be disposed within the inner chamber of the grounded neutral transformer core and/or the inner chamber of the high frequency transformer core.

In some embodiments, the circuit interrupting device may further include a magnetic shield associated with the differential transformer core. The magnetic shield may be disposed below the differential transformer core.

In another aspect of the present disclosure, a method of manufacturing a circuit interrupting device is provided. The method includes stacking a grounded neutral transformer core and a high frequency transformer core and nesting a differential transformer core within a central cavity cooperatively defined by the stacked grounded neutral transformer core and the high frequency transformer core.

In some embodiments, stacking the grounded neutral transformer core and the high frequency transformer core may include positioning the grounded neutral transformer core on the high frequency transformer core or positioning the high frequency transformer core on the grounded neutral transformer core.

It is contemplated that nesting the differential transformer core within the central cavity may include disposing the differential transformer core concentrically within the grounded neutral transformer core and/or the high frequency transformer core.

It is envisioned that the method may further include positioning the differential transformer core on a magnetic shield.

In yet another aspect of the present disclosure, a circuit interrupting device is provided that includes a grounded neutral transformer core, a high frequency transformer core in abutting engagement with the grounded neutral transformer core, and a differential transformer core concentrically disposed within the grounded neutral transformer core and/or the high frequency transformer core.

In some embodiments, the grounded neutral transformer core and the high frequency transformer core may be coaxial with one another.

It is contemplated that the grounded neutral transformer core or the high frequency transformer core may be disposed on top of the other of the grounded neutral transformer core or the high frequency transformer core.

Further scope of applicability of the present disclosure will become apparent from the detailed description given hereinafter. However, it should be understood that the detailed description and specific examples, while indicating preferred embodiments of the present disclosure, are given by way of illustration only, since various changes and modifications within the spirit and scope of the present disclosure will become apparent to those skilled in the art from this detailed description.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the present invention may be more readily understood by one skilled in the art with reference being had to the following detailed description of several embodiments thereof, taken in conjunction with the accompanying drawings wherein like elements are designated by identical reference numerals throughout the several views, and in which:

FIG. 2 is a perspective view of the combined AFCI/GFCI printed circuit board assembly;

Figure 1A:
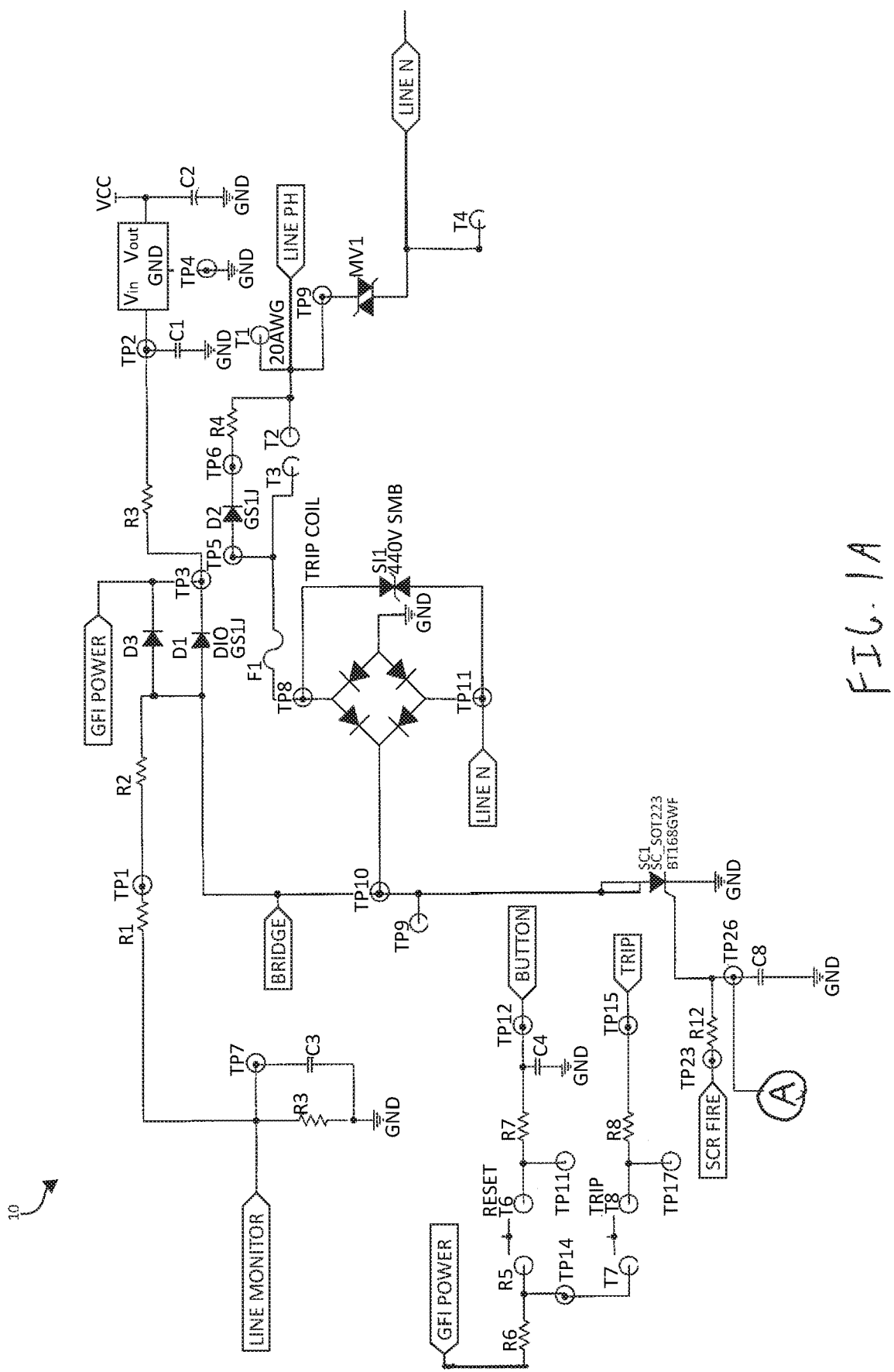
FIGS. 1A-1C collectively illustrate a schematic diagram of a combined arc fault circuit interrupter (AFCI)/ground fault circuit interrupter (GFCI) in accordance with the principles of the disclosure.

The figures depict embodiments of the present disclosure for purposes of illustration only. One skilled in the art will readily recognize from the following discussion that alternative embodiments of the structures and methods illustrated herein may be employed without departing from the principles of the present disclosure described herein.

DETAILED DESCRIPTION

Particular embodiments of the present disclosure are described hereinbelow with reference to the accompanying drawings. However, it is to be understood that the disclosed embodiments are merely exemplary of the disclosure and may be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure.

For the purposes of promoting an understanding of the principles of the present disclosure, reference will now be made to the exemplary embodiments illustrated in the drawings, and specific language will be used to describe the same. It will nevertheless be understood that no limitation of the scope of the present disclosure is thereby intended. Any alterations and further modifications of the inventive features illustrated herein, and any additional applications of the principles of the present disclosure as illustrated herein, which would occur to one skilled in the relevant art and having possession of this disclosure, are to be considered within the scope of the present disclosure.

The present disclosure is directed to fault circuit interrupters and, in particular, a combined AFCI/GFCI device. Among other components, the AFCI portion may include, or be used with a high frequency sensor, a current sensor, and a differential sensor. Generally the current sensor and the differential sensor operate at low frequencies, typically lower than the high frequency sensor. Any one of the three sensors can each be communicatively arranged and configured to measure electrical characteristics of a line or device conductive path such as a phase conductive path or a neutral conductive path. Some of these characteristics can include high frequency signals, current, and current differential on the device current path including one or more of the phase conductive paths and the neutral conductive paths. The sensors may be communicatively arranged and configured such that the positioning of any one of the sensors enables the sensor to read/sense the corresponding electrical parameter(s) associated with any one of, or any pair of conductors, including pairings which are arranged to read differential signals as well as additive signals. Sensor arrangement and/or positioning can include, but not be limited to: adjacent to the device conductive path, electrically coupled to the device conductive path, magnetically coupled to the device conductive path, positioned such that the device conductive path passes through a core of the sensor and/or any combination of the foregoing either in differential or additive arrangements.

For example, the high frequency sensor may be configured to measure high frequency signals, particularly high frequency noise. The current sensor may be configured to measure a current value. The differential sensor may be configured to measure a current differential between, e.g., the phase and neutral conductive paths. The output from the sensors are connected to an analog signal processor circuit that can comprise any suitable circuit elements known in the art such as but not limited to amplifiers, rectifiers, comparators (or a combination thereof), or other elements to condition the signal from one or more of sensors before being input into processor. Alternatively, one or more of the output signals from the sensors may be provided directly to the processor without any analog conditioning.

The processor can be any suitable type of processor such as a microprocessor, microcontroller, ASIC, FPGA, or the like. It should also be noted that the term "processor" can be used interchangeably with microprocessor, microcontroller, ASIC, FPGA, or the like. The processor is configured/programmed to analyze output signals provided by one or more of the sensors and determine if one or more predetermined condition exists; e.g., an arc fault, ground fault, or the like. If the processor detects a predetermined condition, the processor may be configured/programmed to trigger an interrupting mechanism to interrupt power to one or more of the phase and neutral conductive paths, thus disconnecting power to the load.

The GFCI portion of the device includes a grounded neutral (GN) transformer as well as the differential sensor of the AFCI portion and the GN transformer is utilized in sensing or monitoring for grounded neutral faults. By way of example, a GN transformer typically includes a core having hot and neutral lines extending therethrough, which forms a first winding, with a second winding wound on the core. If a grounded neutral fault occurs, the differential sensor and the GN transformer create positive feedback causing circuitry to oscillate. When this happens, the circuitry senses this as a high frequency ground fault and the device trips. A more detailed description of an exemplary GN transformer may be found, for example, in U.S. Pat. No. 6,538,863, the entire contents of which are incorporated by reference herein. The differential sensor may or may not be conditioned by an analog signal processor circuit as described above before being provided to the processor to determine if a dangerous condition exists.

In the embodiments described herein, a combined AFCI/GFCI requires four (4) different sensors or transformer cores to detect one or more predetermined conditions. Because of the four different transformer cores, packaging/layout of the device's electrical, mechanical and electro-mechanical components, as well as routing of the various conductive/current paths so that the AFCI/GFCI is electrically/electro-mechanically operable, physically manufacturable and suitably sized for installation in standard wall boxes becomes challenging. The embodiments described herein arrange/package three of the four sensors/transformer cores in the same physical volume that two transformer cores might otherwise occupy in conventional devices.

Figure 1B:
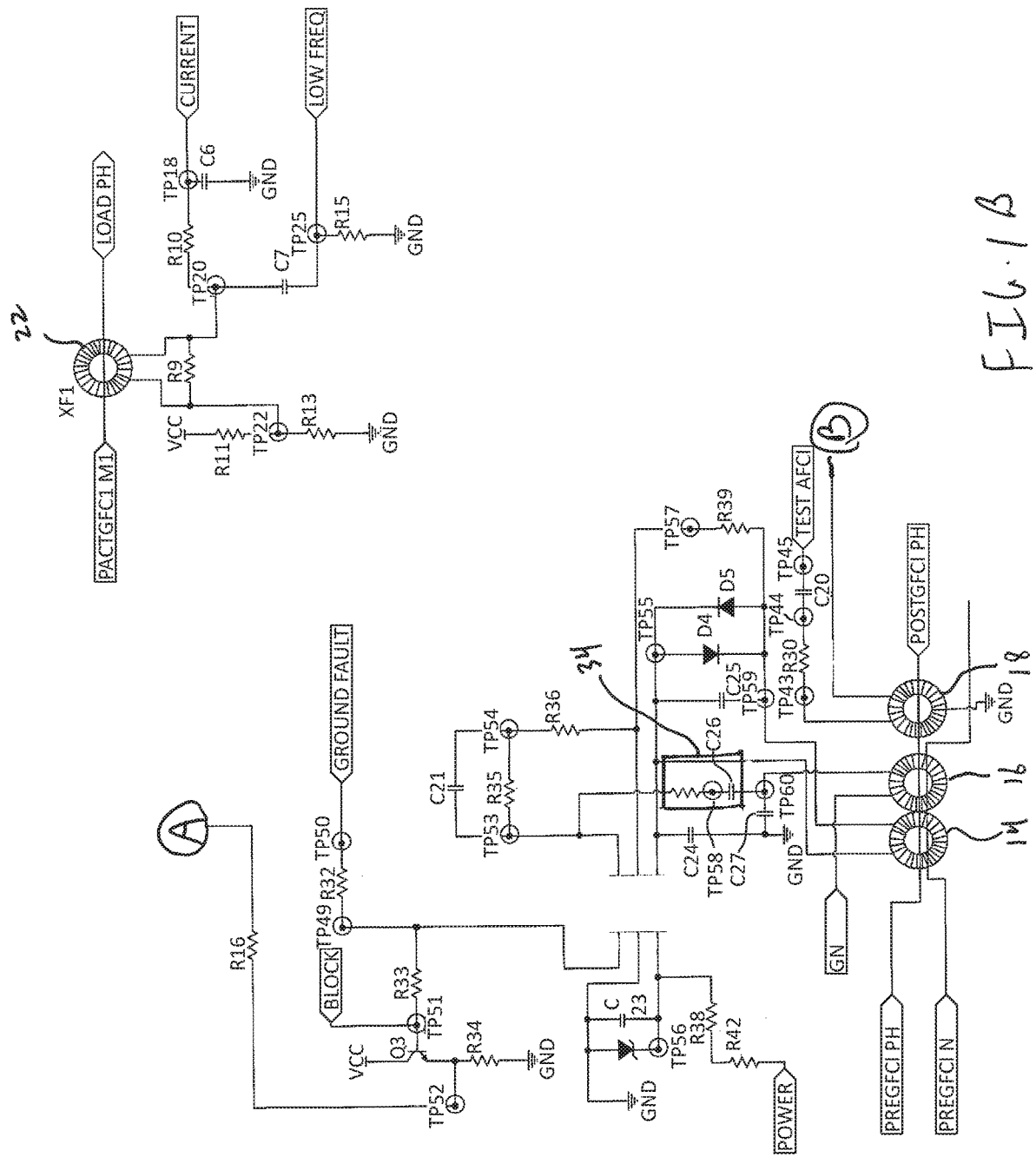
Figure 1C:
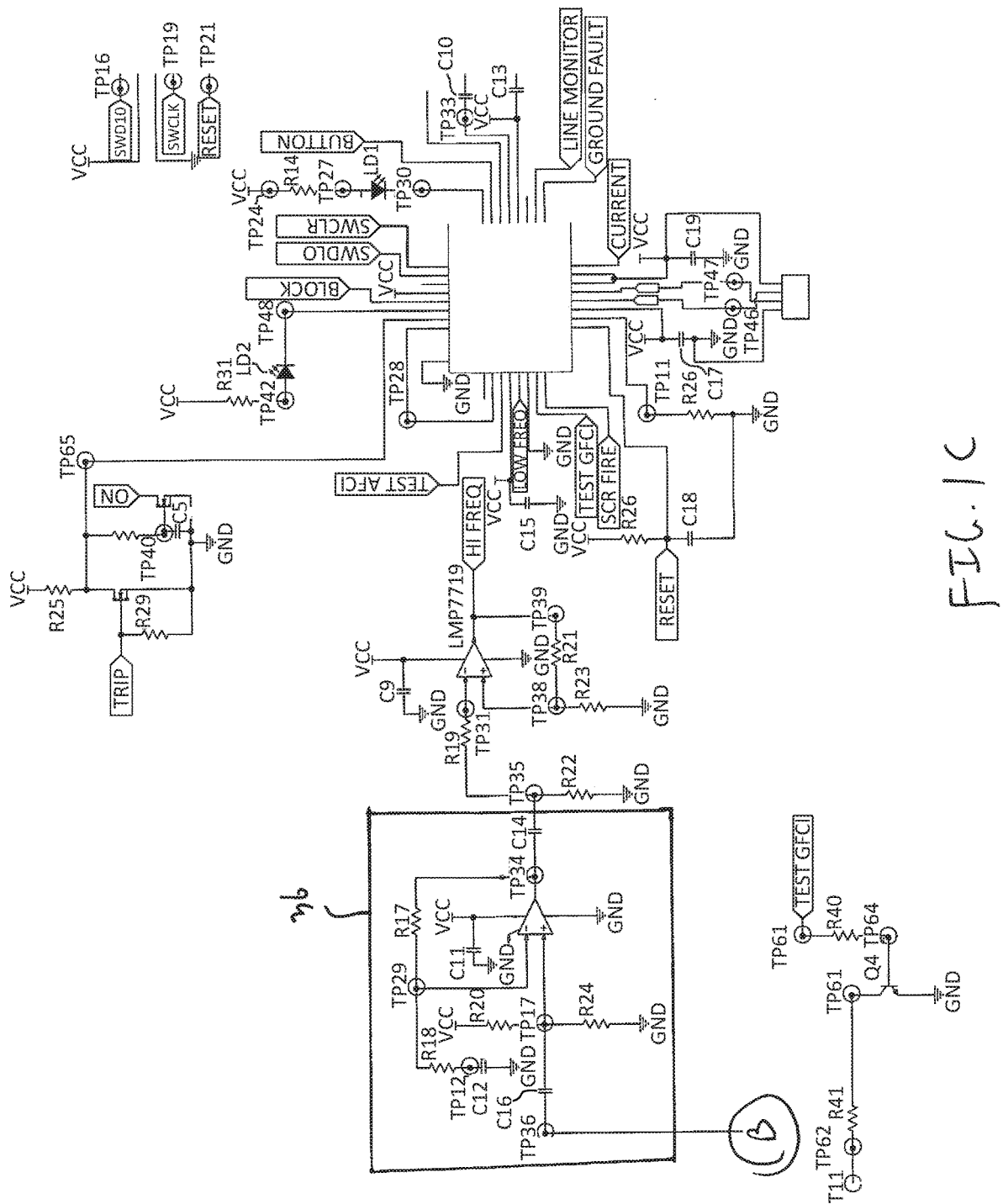
Figure 3:
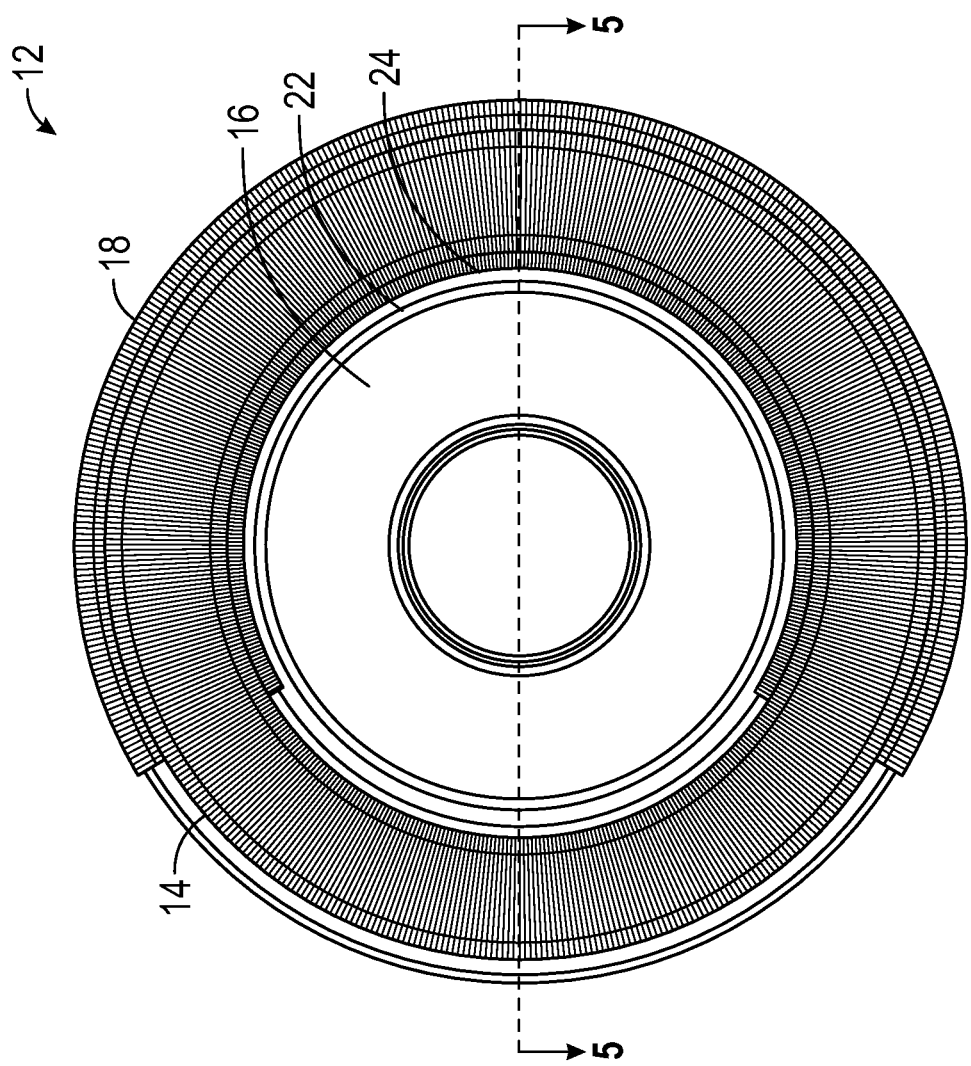
FIG. 3 is a top view of a three core transformer assembly.
Figure 4:
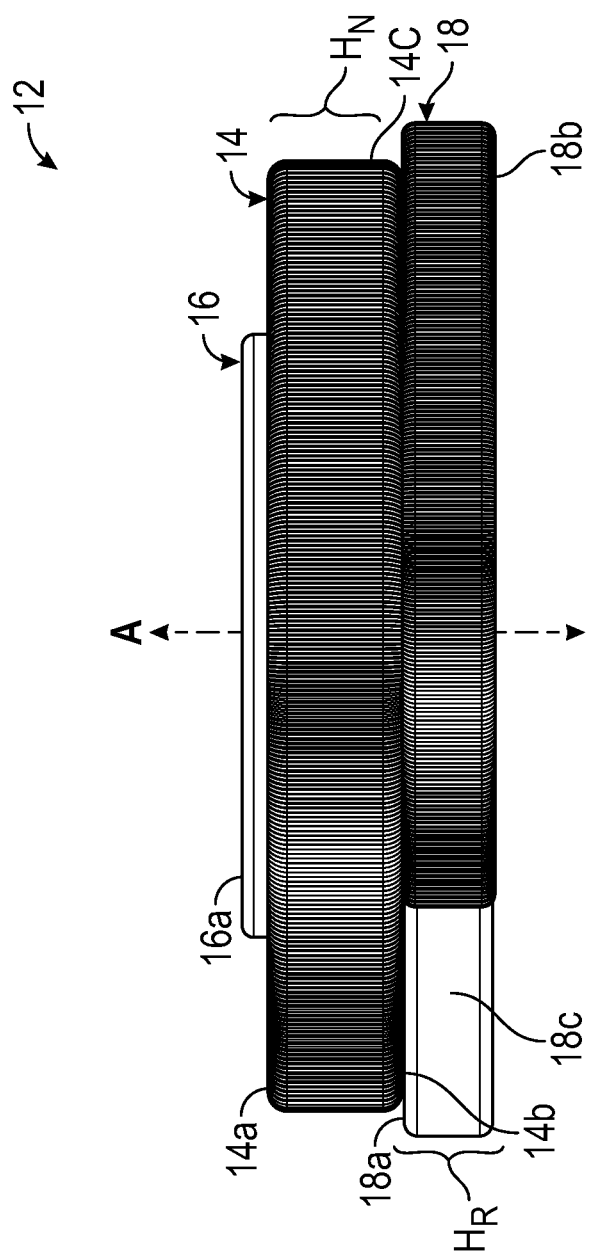
FIG. 4 is a side view of the three core transformer assembly of FIG. 3.
Figure 5:
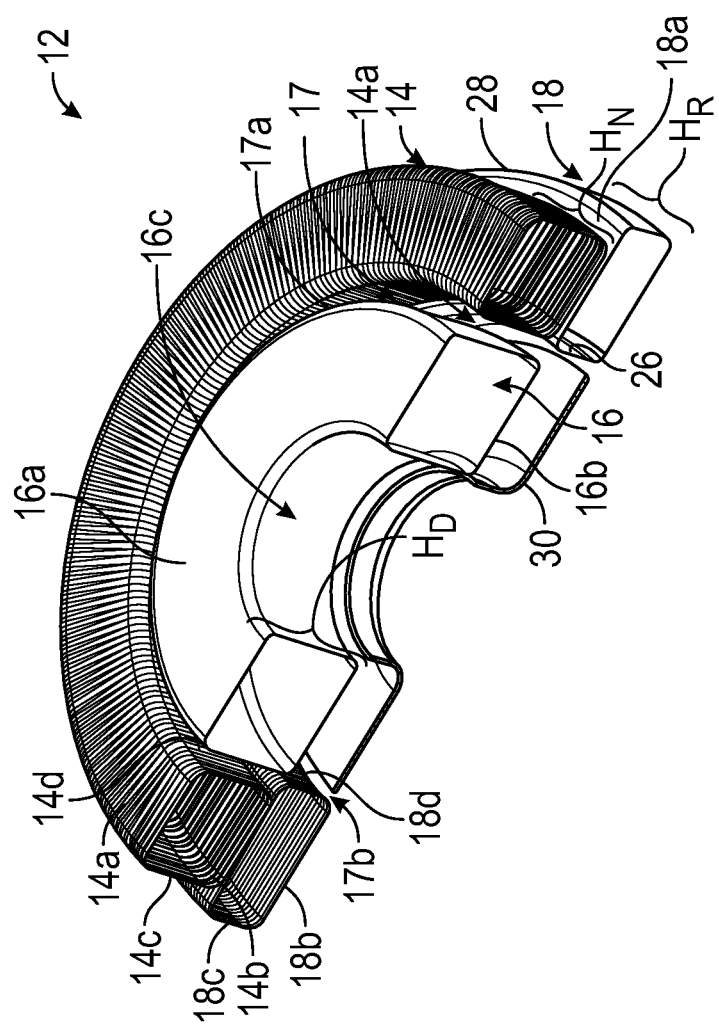
FIG. 5 is a cross-sectional view of the three core assembly of FIG. 3.

Turning to FIGS. 1 and 2, a combined AFCI/GFCI is shown generally as 10. Although FIGS. 1A-1C depict a specific wiring scheme layout, the present disclosure is not limited to such a layout. As shown in FIGS. 1A-1C, AFCI/GFCI 10 has a three core assembly 12 that includes a GN transformer core 14, a differential transformer core 16, and a high frequency transformer core 18, such as, for example, a Rogowski core. In some embodiments, assembly 12 may include a fourth transformer core 22 (FIGS. 1A-1C). FIG. 2 depicts the AFCI/GFCI 10 in its printed circuit board (PCB) assembly configuration 20. The dimensions of PCB assembly 20 permit PCB assembly 20 to be assembled within a single gang device housing for mounting in a standard wall box. The three core assembly 12, which will be discussed in more detail below with reference to the embodiment depicted FIGS. 3-5, is arranged on one side of, and at one end of, the PCB assembly 20, such that the total volume occupied within the device housing is minimized.

In order to minimize the size of the three core assembly 12, the differential transformer core 16 is nested within the GN transformer core 14 and the high frequency transformer core 18, while the GN transformer core 14 and the high frequency transformer core 18 are arranged in a stacked configuration. In particular, the GN transformer core 14 generally has a top surface 14a, a bottom surface 14b, an outer circumferential surface 14c, and an inner circumferential surface 14d that defines a central cavity/volume 17a. The high frequency transformer core 18 also generally has a top surface 18a, a bottom surface 18b, an outer circumferential surface 18c, and an inner circumferential surface 18d that defines a central cavity/volume 17b. As such, each of the GN transformer core 14 and the high frequency transformer core 18 assumes a generally toroidal shape having a generally rectangular transverse cross-section. It is contemplated that all or some of the above-noted surfaces of the GN transformer core 14 and the high frequency transformer core 18 may be flat or arcuate.

The stacked configuration results in one or the other of the GN transformer core 14 and the high frequency transformer core 18 being disposed on, or seated on top of, the other such that the bottom surface 14b or 18b of one transformer core 14 or 18 is in proximal relation/abutting engagement with the top surface 14a or 18a of the other transformer core 14 or 18. In either stacked configuration (i.e., the GN transformer core 14 above/atop the high frequency transformer core 18 or the high frequency transformer core 18 above/atop the GN transformer core 14), the central cavity/volume 17a of GN transformer core 14 and the central cavity/volume 17b of the high frequency transformer core 18 cooperatively define one continuous central bore 17 of the stacked GN transformer core 14 and the high frequency transformer core 18. The central bore 17 of the stacked GN transformer core 14 and the high frequency transformer core 18 is dimensioned for receipt of the differential transformer core 16, as will be described in detail below.

Turning to FIGS. 3-8, three core assembly 12 has an axis A that runs through the center of the central bore 17 of the stacked GN transformer core 14 and the high frequency transformer core 18. In one embodiment where the differential transformer core 16 is concentrically disposed within the central bore 17 of the stacked GN transformer core 14 and the high frequency transformer core 18, the centers of the GN transformer core 14, differential transformer core 16, and high frequency transformer core 18 are all arranged along axis A (i.e., the GN transformer core 14 and the high frequency transformer core 18 are coaxial with one another, and the differential transformer core 16 is concentrically disposed within the GN transformer core 14 and the high frequency transformer core 18).

As described briefly above, the GN transformer core 14 defines an inner chamber or central cavity/volume 17a and the high frequency transformer core 18 defines an inner chamber or central cavity/volume 17b. The differential transformer core 16 is disposed or nested within both the inner chamber 17a of the GN transformer core 14 and the inner chamber 17b of the high frequency transformer core 18. In another embodiment, the differential transformer core 16 is disposed or nested within only the inner chamber 17a of the GN transformer core 14. In yet another embodiment, the differential transformer core 16 is disposed or nested within only the high frequency transformer core 18.

Figure 6:
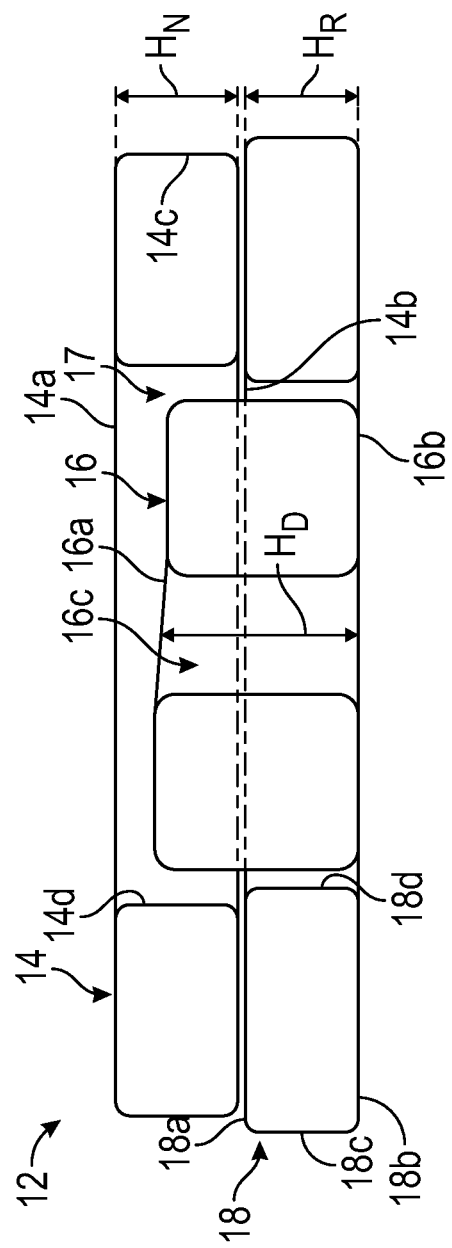
FIG. 6 is a cross-sectional view of another configuration of the three core assembly of FIG. 3.
Figure 7:
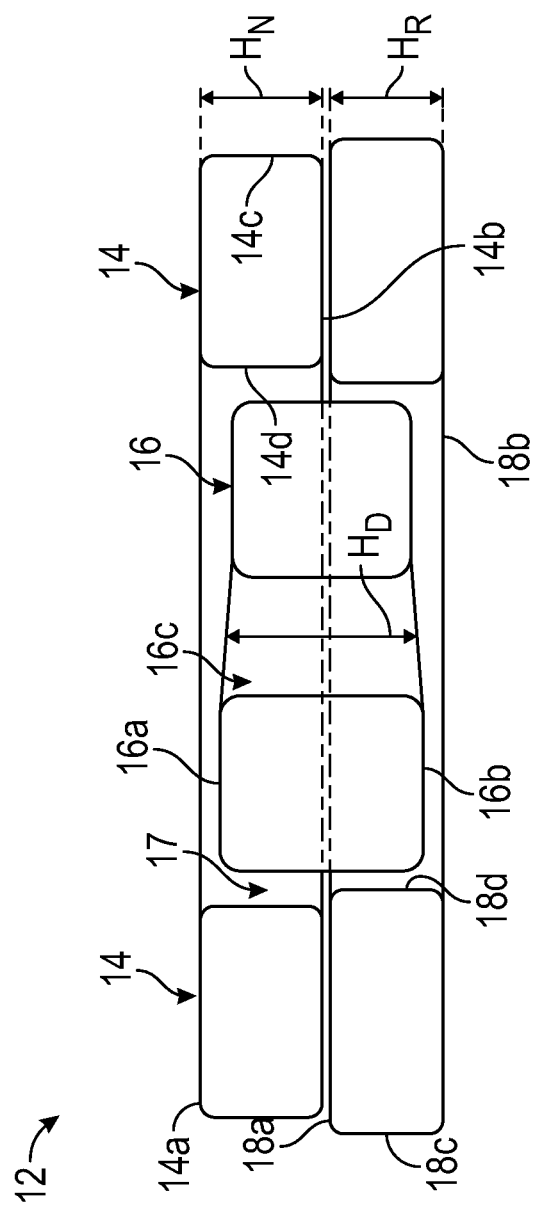
FIG. 7 is a cross-sectional view of yet another configuration of the three core assembly of FIG. 3.
Figure 8:
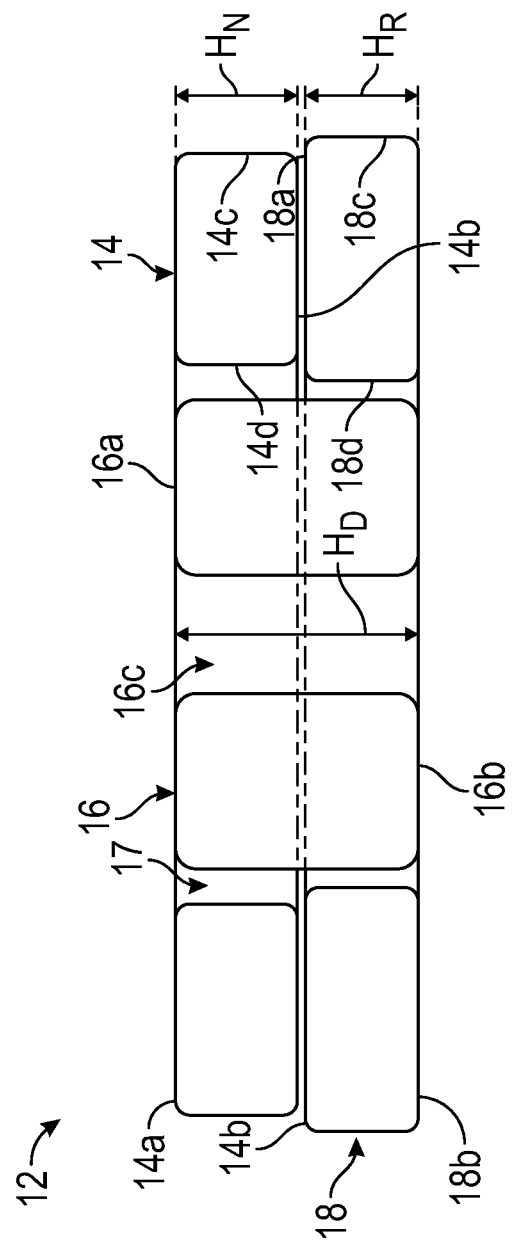
FIG. 8 is a cross-sectional view of yet another configuration of the three core assembly of FIG. 3.

The differential transformer core 16 has a height $H_D$, the GN transformer 14 has a height $H_N$, and the high frequency transformer core 18 has a height $H_R$. In one embodiment, as shown in FIG. 5, the height $H_D$ of the differential transformer core 16 may be less than the combined heights $H_N$ and $H_R$ of the GN transformer core 14 and the high frequency transformer core 18 so that the top surface 16a of the differential transformer core 16 is coplanar with the top surface 14a of the GN transformer core 14 while the bottom surface 16b of the differential transformer core 16 is recessed from the bottom surface 18b of the high frequency transformer core 18. In another embodiment, as shown in FIG. 6, the height $H_D$ of the differential transformer core 16 may be less than the combined heights $H_N$ and $H_R$ of the GN transformer core 14 and the high frequency transformer core 18 so that the top surface 16a of the differential transformer core 16 is recessed from the top surface 14a of the GN transformer core 14 while the bottom surface 16b of the differential transformer core 16 is coplanar with the bottom surface 18b of the high frequency transformer core 18. In yet another embodiment, as shown in FIG. 7, the height $H_D$ of the differential transformer core 16 may be less than the combined heights $H_N$ and $H_R$ of the GN transformer core 14 and the high frequency transformer core 18 so that the top surface 16a of the differential transformer core 16 is recessed from the top surface 14a of the GN transformer core 14 and the bottom surface 16b of the differential transformer core 16 is recessed from the bottom surface 18b of the high frequency transformer core 18. In another embodiment still, as shown in FIG. 8, the height $H_D$ of the differential transformer core 16 may be equal to the combined heights $H_N$ and $H_R$ of the GN transformer core 14 and the high frequency transformer core 18 so that the top surface 16a of the differential transformer core 16 is coplanar with the top surface 14a of the GN transformer core 14 and the bottom surface 16b of the differential transformer core 16 is coplanar with the bottom surface 18b of the high frequency transformer core 18.

In other embodiments (not all explicitly shown), the height $H_D$ of the differential transformer core 16 may be greater than the height $H_N$ of the GN transformer core 14, greater than the height $H_R$ of the high frequency transformer core 18 and/or greater than the combined total height of $H_N$ and $H_R$. As such, the differential transformer core 16 may extend partially or entirely through one or both the GN transformer core 14 and the high frequency transformer core 18. For example, with reference to FIG. 4, the differential transformer core 16 may extend above the top surface 14a of the GN transformer core 14 and below the bottom surface 14b of GN transformer core 14, wherein the differential transformer core 16 only extends partially through the high frequency transformer core 18 without protruding from the bottom surface 18b thereof. In other embodiments, the height $H_D$ of the differential transformer core 16 may be greater than the combined heights $H_N$ and $H_R$ of the GN transformer core 14 and the high frequency transformer core 18 so that the differential transformer core 16 extends above the top surface 14a of GN transformer core 14 and below the bottom surface 18b of high frequency transformer core 18. Alternately, a top surface 16a of the differential transformer core 16 may be disposed within the inner chamber 17a of the GN transformer core 14 without protruding therefrom, and a bottom surface 16b of the differential transformer core 16 may be disposed within the inner chamber 17b of the high frequency transformer core 18 without protruding therefrom, as shown in FIG. 7.

The three core assembly 12 may include a metal magnetic shield 30 disposed below the differential transformer core 16 (i.e., differential transformer core 16 is disposed on top of metal magnetic shield 30). In some embodiments, shield 30 may be placed in alternative positions relative to differential transformer core 16, such as, for example, on top of top surface 16a of differential transformer core 16, between the top and bottom surfaces 16a, 16b of differential transformer core 16, within a central cavity 16c of differential transformer core 16, and/or disposed about the differential transformer core 16. It is contemplated that shield 30 may be fabricated from alternative, non-metallic materials, such as, for example, a dielectric material such that shield 30 may act solely as a spacer or shim. When shield 30 is used as a spacer or shim, shield 30 may raise or lower differential transformer core 16 to the appropriate position within central cavity/volume 17 of the stacked GN transformer core 14 and the high frequency transformer core 18.

In order to minimize the space occupied by the three core assembly 12, the dimensions of the cores of the GN transformer core 14, differential transformer core 16, and high frequency transformer core 18 may be different than the corresponding cores found in conventional AFCIs and GFCIs. In the AFCI/GFCI 10, the height of the GN transformer core 14 is reduced compared to the corresponding GN transformer core in a conventional GFCI. The cross-sectional area of the high frequency core 18 is also different compared to a corresponding high frequency core in a conventional AFCI. Specifically, the height $H_R$ of the high frequency core 18 is reduced, the outer diameter 28 is increased and the inner diameter 26 is reduced when compared to a high frequency core in a conventional AFCI. The cross-sections of each of the transformer cores 14, 16, and 18 are substantially rectangular in shape.

Figure 9:
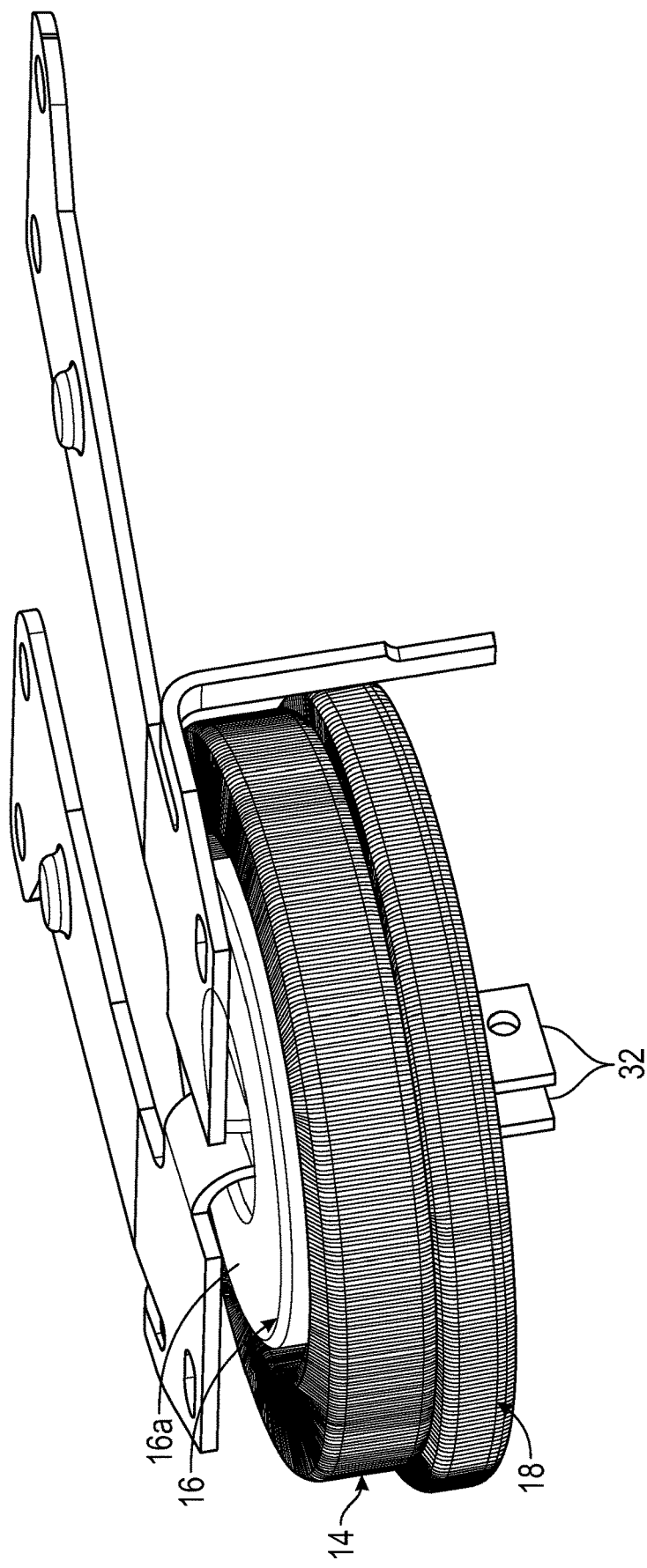
FIG. 9 is a perspective view of the three core transformer assembly of FIG. 3 according to the disclosure.

With reference to FIG. 9, the differential transformer core 16 is nested within the GN transformer core 14 and the high frequency transformer core 18 so that core 16 more closely surrounds conductors 32 passing there-through. The differential transformer core 16 is designed to have a greater degree of sensitivity and precision than the high frequency transformer core 18 and the GN transformer core 14. The differential transformer core 16 is more sensitive, in part, because it needs to detect a difference in current in the milliamp range on a circuit that operates in the 15 Amp range. As such, it is preferable to position the more sensitive and precise differential transformer core 16 within the GN transformer core 14 and the high frequency transformer core 18 so that the core 16 can be symmetrical with respect to the conductors 32 passing therethrough and in closer proximity to said conductors 32. This can minimize load shift which can occur due to the positioning of each of the conductors 32 with respect to the core 16. Such positioning of conductors 32 affects the magnetic flux and the output on the secondary windings. For example, improperly positioned conductors 32 may result in an inaccurate signal being generated by the secondary windings. The three core assembly 12, which includes the GN transformer core 14, differential transformer core 16, and high frequency transformer core 18, is positioned on one side of the PC Board, whereas the fourth transformer core 22 (FIG. 1B) and the current sensor are positioned on the other side of the PC Board. Both phase and neutral conductors pass through the cores of the three core assembly 12 but only the phase conductor passes through the current sensor. As such, the current paths of the phase and neutral conductors are different in their physical routing which can lead to external field effects on the differential transformer core 16. In order to minimize this, as described above, a metal magnetic shield 30 is disposed below the differential transformer core 16.

With respect to electrical performance, when the three cores 14, 16, and 18 are arranged in this manner (i.e., the GN transformer core 14 and the high frequency transformer core 18 are in the stacked configuration and the differential transformer core 16 is disposed concentrically within the stacked GN transformer core 14 and the high frequency transformer core 18), it is important to tune the cores in order to ensure proper operation. In general, an arc fault creates noise in a wide band of frequencies. This noise is small compared to the total power line frequency current and as such, requires amplification in order to be detected. However, building an amp that has a wide bandwidth can be difficult. In addition because of interwinding capacitance of the high frequency transformer core 18, at high frequencies, the high frequency transformer core 18 has very narrow bandwidths. This is due to the fact that at high frequency, the inductive and capacitive components of the signal on the secondary windings affect the resonant frequency of the high frequency transformer core 18. Further, an amp with a wider bandwidth may come at the cost of amplifier efficiency or cost if multiple amplifier stages are required for different portions of the spectrum. As such, it is desirable to limit the frequency response of the amp while still identifying problematic wide band noise indicative of arcing and align it with the resonance frequency of the high frequency transformer core 18. One approach to do this is via empirical experimentation. For example, characteristics of the three cores 14, 16, and 18 can be altered and the output measured in response to a known wideband input signal indicative of arcing. This could be done either directly at the output of a core or at the output of further downstream components such as an amp fed by a core.

Characteristics of the core that can be altered include physical dimensions/shape or electrical design. For example, if the core is in the form of a toroid, its radius and cross-sectional dimension/height can be varied and experimented with such that a relationship can be established between the physical properties and the frequency response. Alternatively, one can vary the number of turns of a secondary winding and determine the corresponding frequency response. In the present embodiment, the high frequency transformer core 18 has secondary windings that surround only a portion of the core. For example, in one embodiment, the secondary windings surround about ¼ of the core. In other words, if the core is a full 360 degree surface of revolution about an axis, the secondary windings surround the core through 90 degrees of the 360 degrees of revolution. This is due to the fact that only a certain number of secondary windings are required in the present application and it is easier, from a manufacturing standpoint, to place the secondary windings directly next to each other on the core than to control the spacing between the secondary windings.

In addition to varying the characteristics of the core, various circuit components may be altered to optimize the design. For example, a ground neutral signal can be tuned by varying the RC circuit R37 & C26 (see box 34 in FIG. 1B). In addition, if the GN transformer core 14 is made physically smaller, corresponding circuitry may have a larger gain to compensate for this. Additionally, components R17, R18, and C12 of amplifier circuit 36 (FIG. 1C) can be altered to optimize the high frequency signal amplification.

In some embodiments, GN transformer core 14 may include an iron alloy, differential transformer core 16 may include an iron wafer assembly, and high frequency transformer core 18 may include a dielectric material.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision additional modifications, features, and advantages within the scope and spirit of the claims appended hereto.

We claim:

1. A circuit interrupting device comprising:
   a current sensor core;
   a core assembly defining a longitudinal axis and including:
   a grounded neutral transformer core;
   a high frequency transformer core, the grounded neutral transformer core and the high frequency transformer core are stacked along the longitudinal axis; and
   a differential transformer core disposed within a cavity defined by both the grounded neutral transformer core and the high frequency transformer core.

2. The circuit interrupting device of claim 1, wherein the high frequency transformer core is a non-ferrous core.

3. The circuit interrupting device of claim 1, further comprising a printed circuit board, wherein the core assembly is located on one side of the printed circuit board and the current sensor core is located on the other side of the printed circuit board.

4. The circuit interrupting device of claim 1, wherein the differential transformer core extends along at least a portion of a height of the grounded neutral transformer core and at least a portion of a height of the high frequency transformer core, the height of each of the grounded neutral transformer core and the high frequency transformer core being defined along the longitudinal axis.

5. The circuit interrupting device of claim 1, wherein at least one of the cores of the core assembly has a cross-section having a perimeter, wherein the perimeter has one or more portions selected from the group consisting of a straight portion and an arcuate portion.

6. The circuit interrupting device of claim 1, further comprising a non-ferrous spacer being configured to position the differential transformer core within the core assembly.

7. The circuit interrupting device of claim 1, further comprising a magnetic shield disposed below the differential transformer core.

8. The circuit interrupting device of claim 1, further comprising a magnetic shield disposed in abutment with the differential transformer core.

9. The circuit interrupting device of claim 1, further comprising a magnetic shield defining a cavity, wherein the differential transformer core defines a differential core cavity, the cavity of the magnetic shield being aligned at least partially with respect to the differential core cavity.

10. The circuit interrupting device of claim 1, further comprising a magnetic shield at least partially surrounding the differential transformer core.

11. The circuit interrupting device of claim 1, wherein the differential transformer core is configured to receive a plurality of conductive paths therethrough.

12. The circuit interrupting device of claim 11, wherein the differential transformer core is arranged symmetrically about the plurality of conductive paths.

13. A method of manufacturing a circuit interrupting device, comprising:
    arranging a plurality of cores into a core assembly, the plurality of cores including a grounded neutral transformer core, a high frequency transformer core, and a differential transformer core, each of the plurality of cores configured to selectively output a signal, wherein the step of arranging further includes:
stacking the grounded neutral transformer core and the high frequency transformer core along a longitudinal axis defined by the core assembly; and
disposing the differential transformer core at least partially within a cavity defined by both the grounded neutral transformer core and the high frequency transformer core.

14. The method of claim 13, further comprising:
extending a conductive path through the cavity;
applying a fault signal indicative of an electrical fault on the conductive path;
selecting at least one of the plurality of cores and taking a first measurement of a frequency response of the output signal of the selected core;
tuning the selected core such that the frequency response is varied; and
taking a second measurement of the frequency response.

15. The method of claim 14 wherein the step of tuning includes varying at least one characteristic of the selected core, the characteristic selected from the group consisting of:
a height;
an inside diameter;
an outside diameter;
a cross-sectional shape;
a cross-sectional area;
a number of winding turns;
a winding wire gauge; and
a spacing of the winding turns.

16. The method of claim 14 wherein the second measurement of the frequency response of the output signal of the selected core is narrowed.

17. The method of claim 16 wherein the fault signal includes one or more of a ground fault and an arc fault.

18. The method of claim 17, wherein the frequency response of the output signal of the selected core is aligned with respect to wide band noise indicative of the fault signal.

19. The method of claim 14, further comprising:
receiving the output signal of the selected core at an input of a signal processor circuit;
the signal processor circuit generating a processed signal output;
wherein the step of tuning further includes varying the processing done by the signal processor circuit.

20. The method of claim 19, wherein the signal processor circuit further includes an amplifier having a gain and the step of varying the processing done by the signal processor circuit further includes varying the gain of the amplifier.

21. The method of claim 19, wherein the signal processor circuit further includes a resistor-capacitor (RC) network, wherein the step of varying the processing done by the signal processor circuit further includes varying the value of one or more of a resistor and a capacitor of the RC network.

22. The method of claim 19, wherein the signal processor circuit further includes a processor, wherein the step of varying the processing done by the signal processor circuit further includes varying a programming of the processor.

* * * * *